United States Patent
Her et al.

(10) Patent No.: US 11,462,393 B2
(45) Date of Patent: Oct. 4, 2022

(54) PLASMA ETCHING METHOD USING FARADAY CAGE

(71) Applicant: LG CHEM, LTD., Seoul (KR)

(72) Inventors: Eun Kyu Her, Daejeon (KR); Song Ho Jang, Daejeon (KR); Chung Wan Kim, Daejeon (KR); Bu Gon Shin, Daejeon (KR); Jeong Ho Park, Daejeon (KR); Jung Hwan Yoon, Daejeon (KR); So Young Choo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 299 days.

(21) Appl. No.: 16/765,839

(22) PCT Filed: Dec. 14, 2018

(86) PCT No.: PCT/KR2018/015930
§ 371 (c)(1),
(2) Date: May 20, 2020

(87) PCT Pub. No.: WO2019/132345
PCT Pub. Date: Jul. 4, 2019

(65) Prior Publication Data
US 2020/0365379 A1 Nov. 19, 2020

(30) Foreign Application Priority Data
Dec. 26, 2017 (KR) .......................... 10-2017-0179300

(51) Int. Cl.
*H01J 37/32* (2006.01)
*B29C 33/38* (2006.01)
(Continued)

(52) U.S. Cl.
CPC .... *H01J 37/32651* (2013.01); *B29C 33/3842* (2013.01); *H01J 37/32449* (2013.01);
(Continued)

(58) Field of Classification Search
CPC ..................... H01J 37/32651; H01J 2237/334
See application file for complete search history.

(56) References Cited

U.S. PATENT DOCUMENTS

| | | |
|---|---|---|
| 8,216,748 B2 | 7/2012 | Jang et al. |
| 9,493,345 B2 | 11/2016 | Cho et al. |

(Continued)

FOREIGN PATENT DOCUMENTS

| | | |
|---|---|---|
| CN | 101750874 A | 6/2013 |
| JP | 2014-58151 A | 4/2014 |

(Continued)

*Primary Examiner* — Joseph L Williams
(74) *Attorney, Agent, or Firm* — Dentons US LLP

(57) ABSTRACT

A plasma etching method using a Faraday cage, including: providing an etch substrate in a Faraday cage, where the etch substrate includes a metal mask provided on one surface thereof, and where an upper surface of the Faraday cage is provided with a mesh portion; a first patterning step of forming a first pattern area on the etch substrate; and a second patterning step of forming a second pattern area on the etch substrate after shielding at least a part of the mesh portion with a shutter. The first pattern area includes a first groove pattern having a depth gradient of 0 to 40 nm per 5 mm, and the second pattern area includes a second groove pattern having a depth gradient of 50 to 300 nm per 5 mm.

17 Claims, 15 Drawing Sheets

(51) Int. Cl.
*B29L 11/00* (2006.01)
*F21V 8/00* (2006.01)

(52) U.S. Cl.
CPC ..... *B29L 2011/0075* (2013.01); *G02B 6/0038* (2013.01); *G02B 6/0065* (2013.01); *H01J 2237/334* (2013.01)

(56) References Cited

U.S. PATENT DOCUMENTS

| | | |
|---|---|---|
| 9,659,797 B1 | 5/2017 | Burckel et al. |
| 2014/0123895 A1 | 5/2014 | Kato et al. |
| 2015/0037597 A1 | 2/2015 | Kim et al. |
| 2015/0296617 A1 | 10/2015 | Hurwitz et al. |
| 2015/0368093 A1 | 12/2015 | Cho et al. |

FOREIGN PATENT DOCUMENTS

| | | |
|---|---|---|
| JP | 2014-072272 A | 4/2014 |
| JP | 6115300 B2 | 3/2017 |
| KR | 10-2000-0033006 A | 6/2000 |
| KR | 10-0281241 B1 | 11/2000 |
| KR | 10-0451291 B1 | 1/2005 |
| KR | 10-1409387 B1 | 12/2014 |
| KR | 10-1576205 B1 | 12/2015 |
| KR | 10-1666672 B1 | 10/2016 |
| KR | 10-1690828 B1 | 12/2016 |
| KR | 10-2017-0052529 A | 5/2017 |
| TW | 201432778 A | 8/2014 |
| TW | 201628045 A | 8/2016 |
| WO | 2013/147966 A2 | 10/2013 |
| WO | 2017056138 A1 | 4/2017 |

[Figure 1(A)]
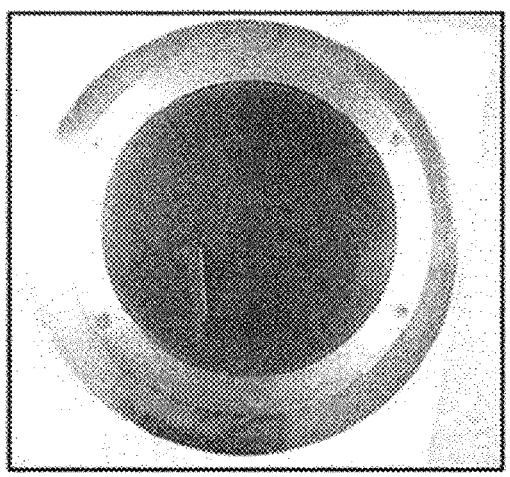
[Figure 1(B)]
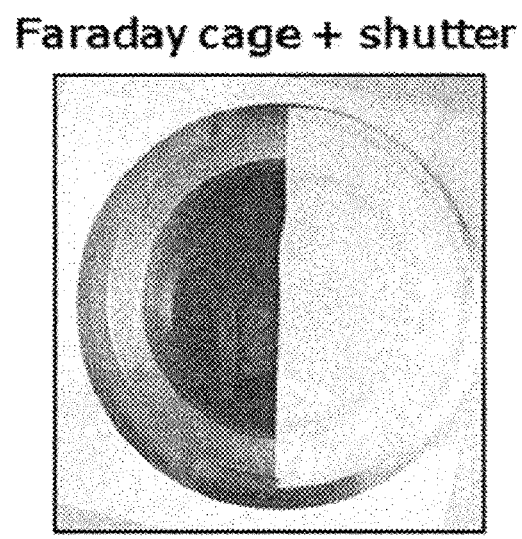

[Figure 2]
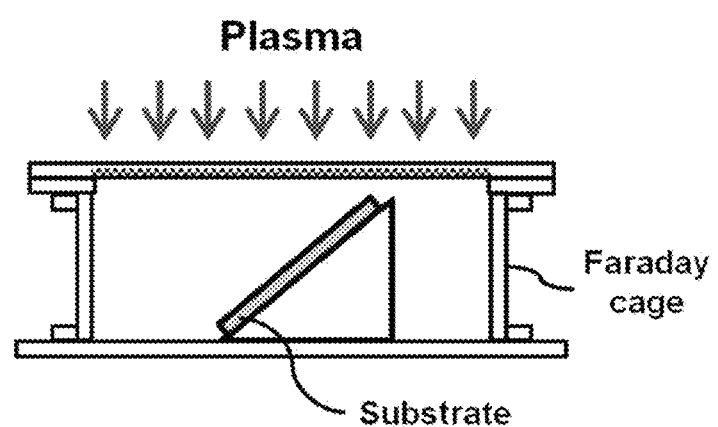

[Figure 3]
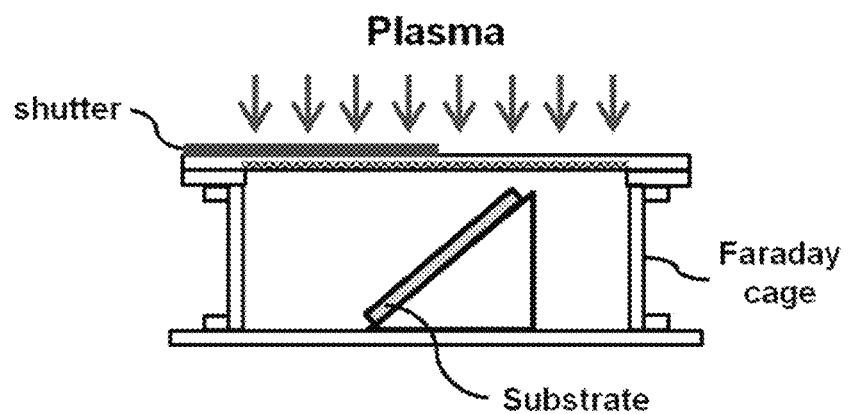

[Figure 4]
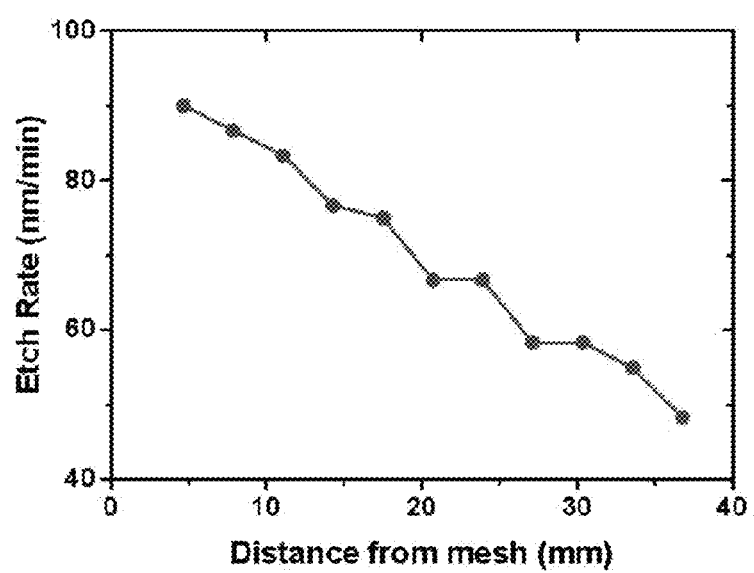

[Figure 5]
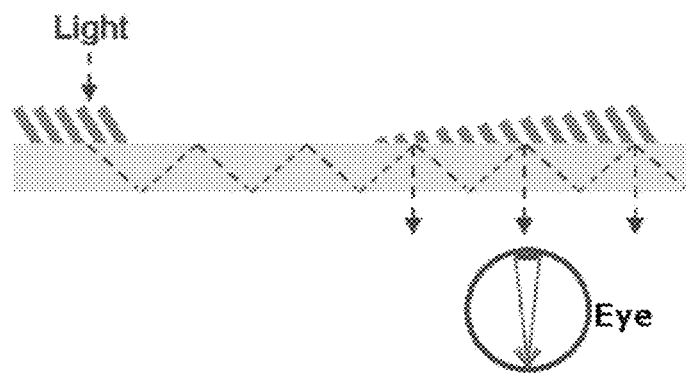

[Figure 6]
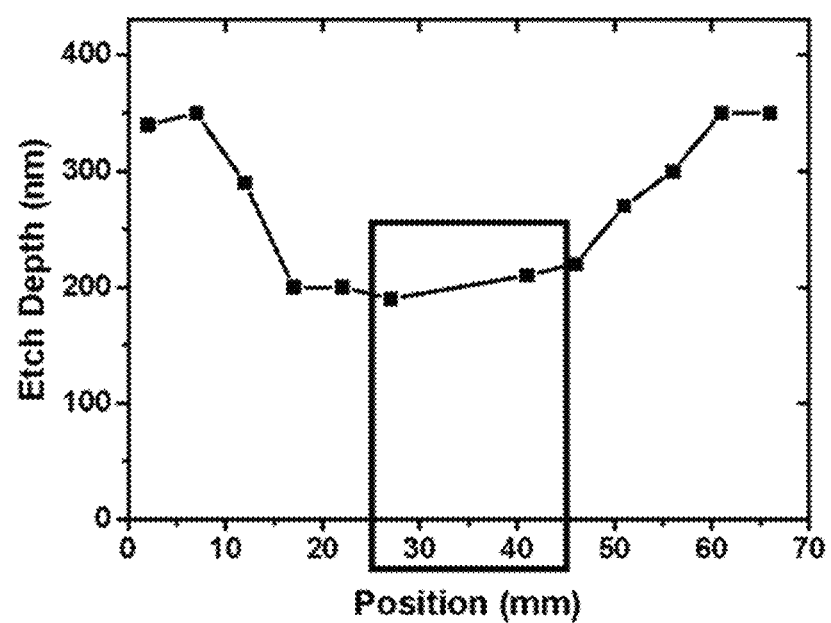

[Figure 7]
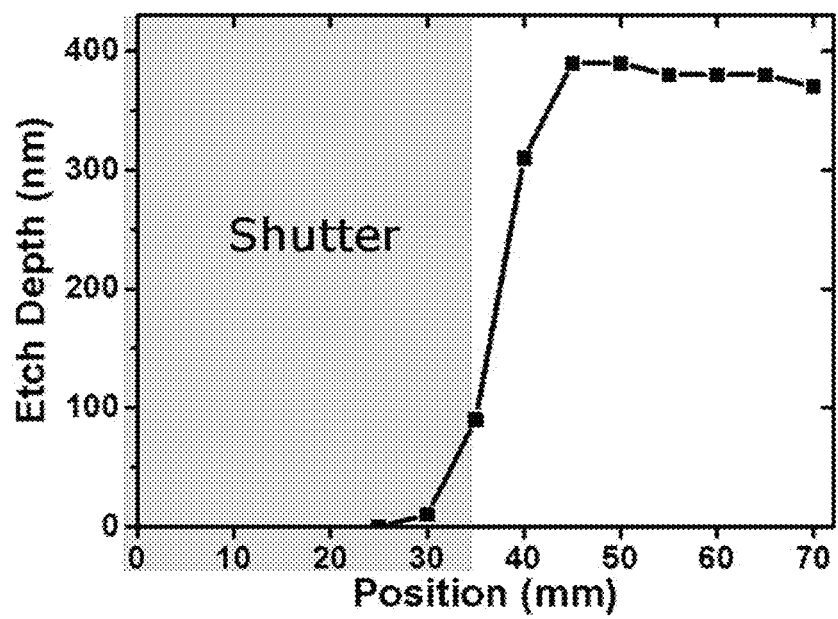

[Figure 8]
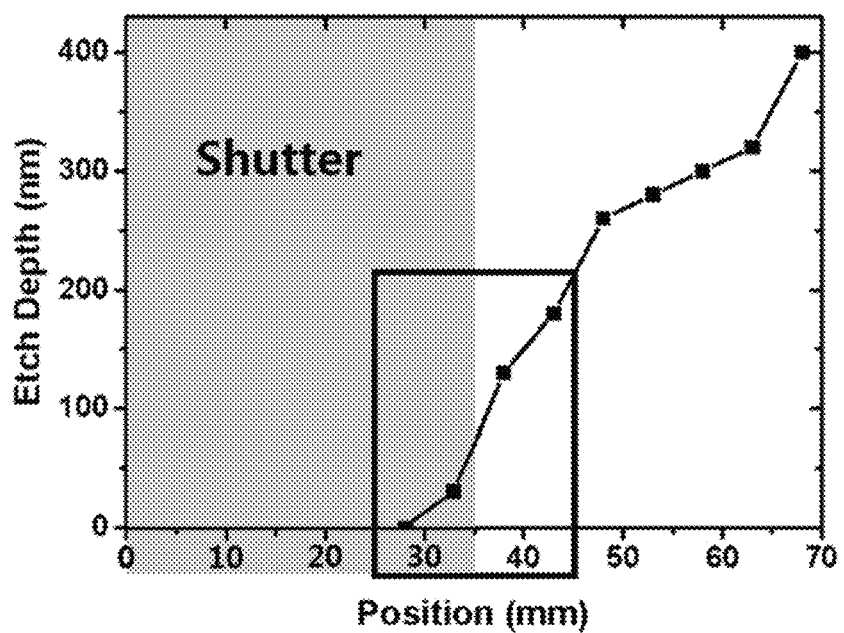

[Figure 9]
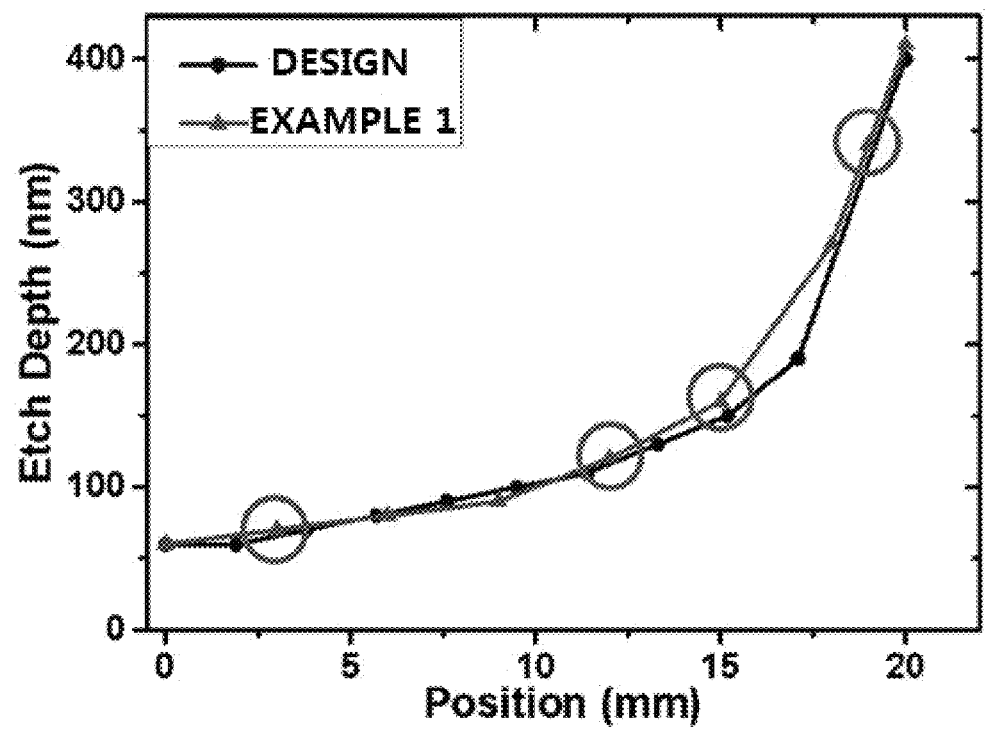

[Figure 10]
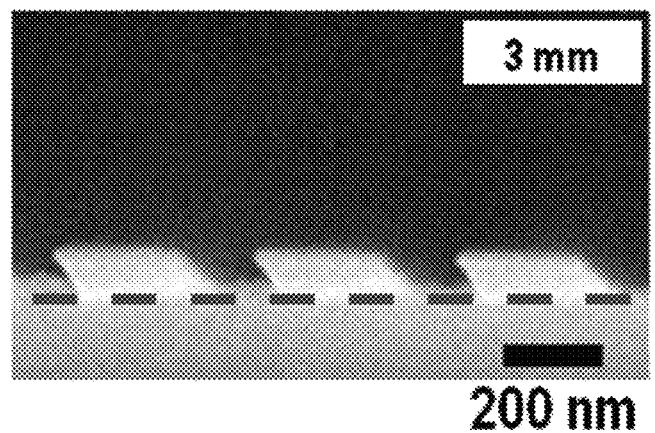

[Figure 11]
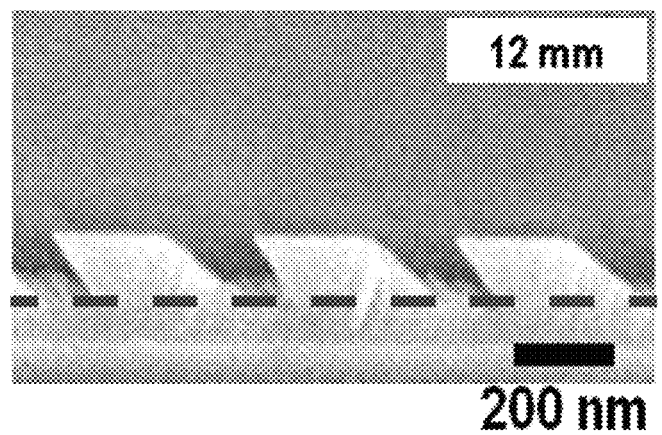

[Figure 12]
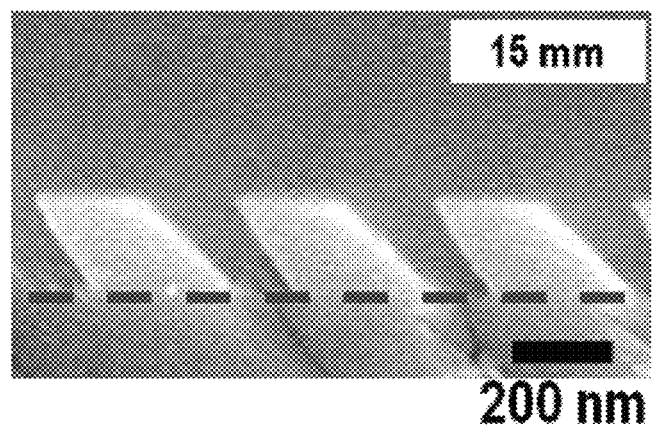

[Figure 13]
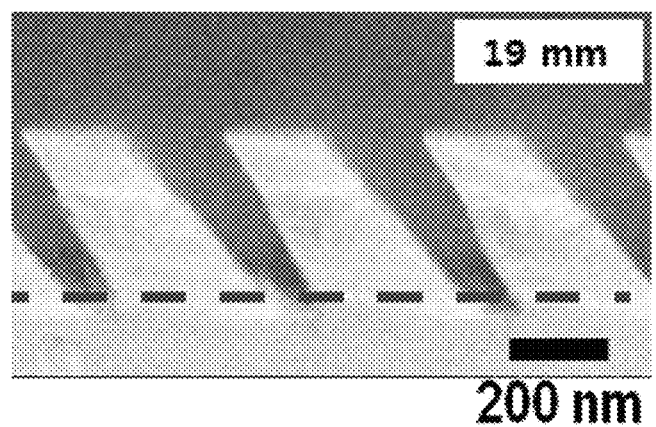

[Figure 14]
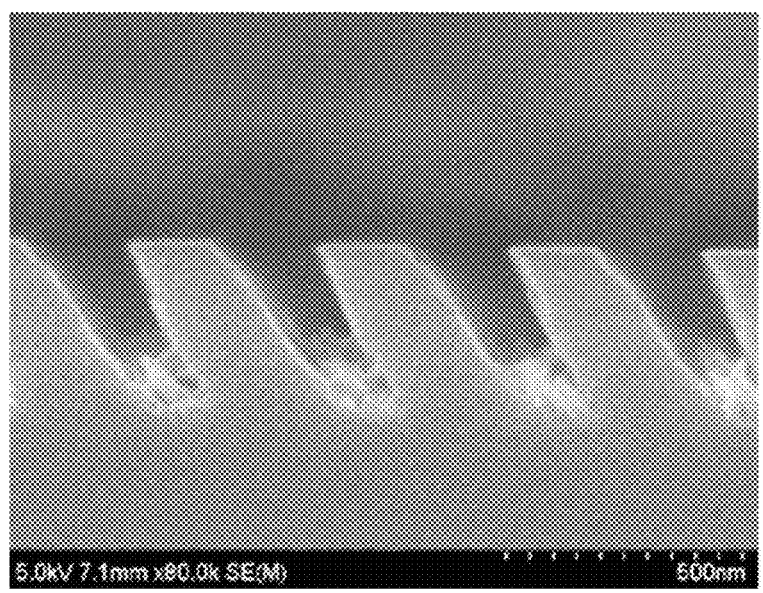

[Figure 15]
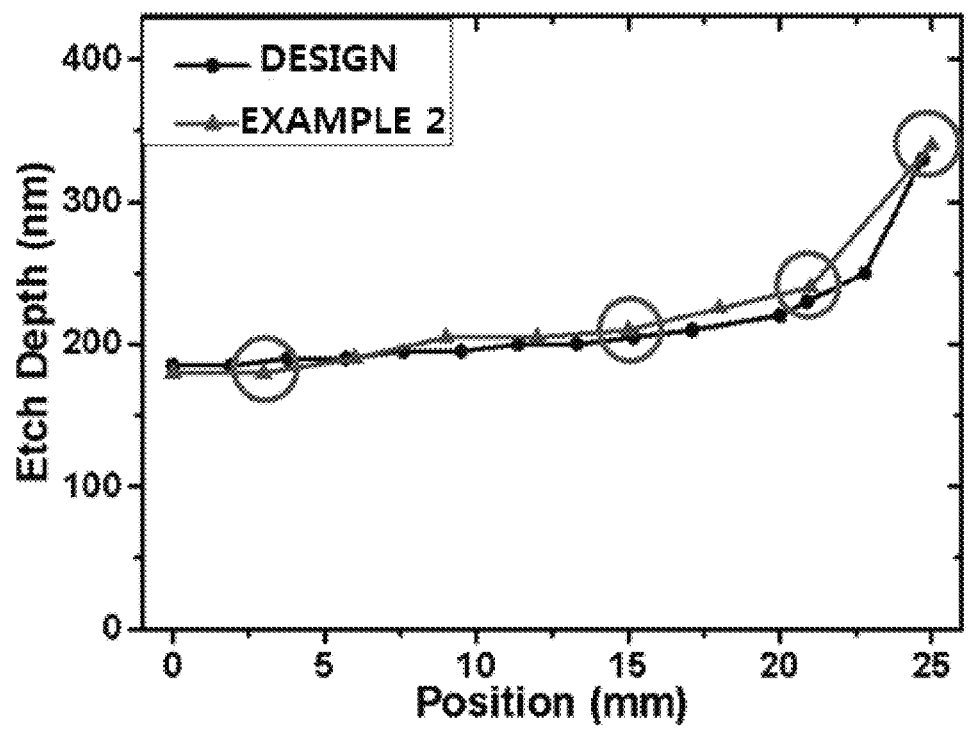

PLASMA ETCHING METHOD USING FARADAY CAGE

CROSS-REFERENCE TO RELATED APPLICATIONS

This application is a U.S. national stage application of international Application No. PCT/KR2018/015930 filed on Dec. 14, 2019, and claims priority to and the benefit of Korean Patent Application No. 10-2017-0179300 filed in the Korean Intellectual Property Office on Dec. 26, 2017, the entire contents of which are incorporated herein by reference.

TECHNICAL FIELD

This application relates to a plasma etching method using a Faraday cage.

BACKGROUND

In order to display a desired image to a user on a display, a light guide plate for changing a state of visible light can be used. The light guide plate can interact with visible light incident through reflection, refraction, or diffraction, and can allow the user to see the desired image by controlling such an interaction. The light incident on the light guide plate may interact with a structure provided on the light guide plate, and diffraction may occur. This caused by a wave nature of the light, and may be expressed by interference of light waves. When the light incident on the light guide plate meets a periodic structure, the light is divided into beams in different directions by the diffraction of the light to be viewed by the user.

It is necessary to study a method for forming a microstructure of the light guide plate so that the light incident on the light guide plate is output at a constant intensity on the display to display the desired image to the user through the display without distortion.

RELATED REFERENCE

Korean Patent Registration No. KR 10-1131101 B1

SUMMARY

The present invention has been made in an effort to provide a plasma etching method using a Faraday cage.

However, the object to be solved by the present invention is not limited to the aforementioned object and other objects, which are not mentioned above, will be apparent to a person having ordinary skill in the art from the following description.

An embodiment of the present invention provides a plasma etching method using a Faraday cage, which includes: providing a substrate for etching in which a metal mask having an opening pattern portion is provided on one surface in a Faraday cage provided with a mesh portion on an upper surface; a first patterning step of forming a first pattern area on the substrate for etching by using plasma etching; and a second patterning step of forming a second pattern area on the substrate for etching by using the plasma etching after shielding at least a part of the mesh portion by using a shutter, in which the first pattern area includes a first groove pattern having a depth gradient of 0 to 40 nm per 5 mm and the second pattern area includes a second groove pattern having a depth gradient of 50 to 300 nm per 5 mm.

A plasma etching method according to an embodiment of the present invention can form a groove pattern having a small depth gradient and a groove pattern having a large depth gradient by simply including a shutter in a Faraday cage.

A plasma etching method according to an embodiment of the present invention can effectively control a needle-shaped structure that can be formed on the bottom surface of the groove pattern.

A plasma etching method according to an embodiment of the present invention is advantageous in that an inclined groove pattern with a uniform slope can be formed on a substrate for etching and a change in a depth gradient of the inclined groove pattern and the position where the depth gradient is applied can be controlled.

A plasma etching method according to an embodiment of the present invention is advantageous in that a mold substrate for a diffraction grating light guide plate having excellent precision can be manufactured by a simple process.

BRIEF DESCRIPTION OF DRAWINGS

FIG. 1(A) is a photograph showing a Faraday cage used in an exemplary embodiment and FIG. 1(B) is a photograph of the Faraday cage when equipped with a shutter.

FIG. 2 is a schematic illustration of a first patterning step of a plasma etching method according to an exemplary embodiment.

FIG. 3 is a schematic illustration of a second patterning step of a plasma etching method according to an exemplary embodiment.

FIG. 4 is a graph showing an etching rate according to a distance of the etch substrate from a mesh portion of a Faraday cage.

FIG. 5 illustrates a principle of action of a diffraction grating light guide plate comprising a patterned etching substrate manufactured using a plasma etching method according to an embodiment of the present invention.

FIG. 6 illustrates an etching depth in a vertical direction for each position during inclination etching according to Reference Example 1.

FIG. 7 illustrates an etching depth in a vertical direction for each position during inclination etching according to Reference Example 2.

FIG. 8 illustrates an etching depth in a vertical direction for each position during inclination etching according to Reference Example 3.

FIG. 9 illustrates an etching depth in a vertical direction for each position during inclination etching according to Example 1.

FIG. 10 is a scanning electron microscope (SEM) image of an etching portion observed at a distance of 3 mm from a glass substrate etched according to Example 1.

FIG. 11 is an SEM image of an etching portion when observed at a distance of 12 mm from a glass substrate etched according to Example 1.

FIG. 12 is an SEM image of an etching portion when observed at a distance of 15 mm from a glass substrate etched according to Example 1.

FIG. 13 is an SEM image of an etching portion when observed at a distance of 19 mm from a glass substrate etched according to Example 1.

FIG. 14 illustrates an etching portion in the vicinity of the glass substrate etched by approximately 10 mm according to Reference Example 1.

FIG. 15 is a graph showing an etching depth for each position during vertical etching according to Example 2.

DETAILED DESCRIPTION

Throughout the specification, unless explicitly described to the contrary, the word "comprise" and variations such as "comprises" or "comprising" will be understood to imply the inclusion of stated elements but not the exclusion of any other elements.

In the specification, it will be understood that when a member is referred to as being "on" another member, the corresponding member may be directly on the other member or intervening members may also be present between the both members.

In the specification, the term of a degree used, "step (of ~)" or "step of ~" does not mean "step for".

In the present invention, a Faraday cage means a closed space made of a conductor and when the Faraday cage is installed in plasma, a sheath is formed on an outer surface of a cage and an electric field is kept constant inside the cage. In this case, when an upper surface of the Faraday cage is formed by the mesh portion, the sheath is formed along the surface of the mesh portion. Therefore, in the case of performing plasma etching using the Faraday cage, ions accelerated in a direction perpendicular to the sheath formed horizontally on the surface of the mesh portion are incident on the inside of the Faraday cage and then, reach the substrate while maintaining directionality when being incident to etch the substrate. Furthermore, in the present invention, the surface of the substrate inside the Faraday cage is fixed in a horizontal or inclined state with respect to a mesh surface and the ions are incident in a direction perpendicular to the mesh surface, and as a result, the substrate may be etched in a direction perpendicular or inclined to the surface of the substrate. Specifically, the Faraday cage according to an embodiment of the present invention may be a conductive box formed by the mesh portion having a conductive upper surface. Further, according to an embodiment of the present invention, an etching direction of the plasma etching may be a direction perpendicular to the surface of the mesh portion of the Faraday cage.

In the case of the plasma etching using the Faraday cage, the ions passing through the mesh portion collide with neutral particles existing in the inside of the Faraday cage while moving toward the substrate, so that kinetic energy is lost, and as a result, a density of the ions tends to be inversely proportional to a distance of the mesh portion. That is, the closer to the mesh portion on which the ions are incident, the higher an etching speed and the further away from the mesh portion, the lower the etching speed. Plasma etching using the Faraday cage in the related art has limited use due to a problem of etching uniformity when a diameter of the substrate increases or when the distance between the mesh portion and the bottom of the substrate becomes too large during inclined etching. Specifically, it is difficult to increase accuracy of etching when a high etching area and a low etching area are irregularly mixed for each position of the Faraday cage during the plasma etching using the Faraday cage in the related art and there is a limitation such as an ion beam dispersion effect in which the diameter of the ion beam increases when a progress distance of the ion is longer.

In addition, a needle-shaped structure having low reflectance is formed in the etching area by plasma etching, specifically, a self-masking mechanism in an etching process of a quartz substrate using an inductively coupled plasma reactive ion etching apparatus (ICP-RIE). Such a needle-shaped structure is also called a black silicon, and is present in the etching area in the shape of a needle having a diameter of several tens to several hundreds of nm, which greatly decreases the reflectance of the surface of the quartz substrate and functions as an element that interferes with precise etching.

In order to enhance an image quality of a wearable device such as a virtual reality device or an augmented reality device, a more precise pattern design of the diffraction grating light guide plate applied to the wearable device is required. Specifically, in order to control luminance uniformity of an image output to the wearable device, there is a need to finely adjust a depth variation of a grating groove portion in each diffraction area based on calculated diffraction efficiency. It may be necessary to implement an area in which the depth gradient of the grating groove portion rises sharply during a more precise pattern design of the diffraction grating light guide plate and it is difficult to form the grating groove portion of an area having a large depth gradient by the plasma etching through a general Faraday cage and as a result of continuing a study for solving the difficulty, the following inventions have been developed.

Hereinafter, the present invention will be described in more detail.

An embodiment of the present invention provides a plasma etching method using a Faraday cage, which includes: providing a substrate for etching in which a metal mask having an opening pattern portion is provided on one surface in a Faraday cage provided with a mesh portion on an upper surface; a first patterning step of forming a first pattern area on the substrate for etching by using plasma etching; and a second patterning step of forming a second pattern area on the substrate for etching by using the plasma etching after shielding at least a part of the mesh portion by using a shutter, in which the first pattern area includes a first groove pattern having a depth gradient of 0 to 40 nm per 5 mm and the second pattern area includes a second groove pattern having a depth gradient of 50 to 300 nm per 5 mm.

As a result of continuing the study on the plasma etching using the Faraday cage, the present inventors have found that the etching rate during plasma etching is greatly changed when a part of the mesh portion of the Faraday cage is shielded by a shutter. Specifically, it is difficult to control the degree of change in the etching rate due to an increase in the distance of the Faraday cage from the mesh portion when performing the plasma etching using the Faraday cage without the shutter. On the contrary, it has been found that the change in etching rate due to the increase of the distance from the mesh portion in an etching area adjacent to an area shielded by the shutter may be controlled to develop the invention when a partial area of the mesh portion of the Faraday cage is shielded by using the shutter.

Furthermore, it has been found that the generation of the needle-shaped structure occurring in the etching area may be greatly reduced when the plasma etching is performed after the shutter is provided in the mesh portion of the Faraday cage.

According to an embodiment of the present invention, the shutter may continuously shield a predetermined area of the mesh portion.

According to an embodiment of the present invention, the shutter may shield 20 to 80% of the mesh portion. Specifically, the shutter may shield 30 to 60% of the mesh portion or 40 to 60%. Specifically, the shutter may shield 50% of the mesh portion.

FIGS. 1(A) and 1(B) are photographs showing a Faraday cage with an without a shutter accordingly to an exemplary embodiment. Specifically, FIG. 1(A) is a photograph of a mesh portion surface of the Faraday cage without the shutter and FIG. 1(B) is a photograph of the mesh portion surface of the Faraday cage with the shutter.

According to an embodiment of the present invention, the shutter may be made of an aluminum oxide material. However, the material of the shutter is not limited thereto and shutters of various materials may be used.

According to an embodiment of the present invention, the substrate for etching may be provided on a flat support having a bottom surface and a horizontal surface of the Faraday cage or on a support having an inclined surface. Specifically, when the substrate for etching is vertically etched to form the vertical groove pattern, the flat support may be used and when the substrate for etching is inclinedly etched to form the inclined groove pattern, the support having the inclined surface may be used.

According to an embodiment of the present invention, the substrate for etching may be provided on a support having an inclined surface and the first groove pattern and the second groove pattern may be inclined groove patterns.

According to an embodiment of the present invention, an inclination angle of the support may be 0° or more and 60° or less or 35° or more and 45° or less. By adjusting the inclination angle of the support, the inclination angles of the first groove pattern and the second groove pattern may be adjusted.

By adjusting the inclination angle of the support to the above range, an average inclination angle of the first groove pattern and the second groove pattern may be adjusted to 0° to 55° or 30° to 40°. For example, by adjusting the inclination angle of the support to 35°, a minimum inclination angle of the first groove pattern and the second groove pattern may be adjusted to 27°, a maximum inclination angle may be adjusted to 36°, and the average inclination angle may be adjusted to 33°. Further, by adjusting the inclination angle of the support to 40°, the minimum inclination angle of the first groove pattern and the second groove pattern may be adjusted to 32°, the maximum inclination angle may be adjusted to 40°, and the average inclination angle may be adjusted to 36°.

According to an embodiment of the present invention, the first patterning step may be patterning the substrate for etching by plasma etching the substrate for etching by using the Faraday cage without the shutter.

FIG. 2 is a schematic illustration of a first patterning step in a plasma etching method according to an embodiment of the present invention. Specifically, FIG. 2 illustrates that the support having the inclined surface is provided in the Faraday cage and then, a quartz substrate is provided on the inclined surface and the substrate for etching is patterned by using the plasma etching.

In the case of the plasma etching using the Faraday cage, the etching speed tends to decrease gradually as the distance from the mesh portion increases, so that a first pattern area may be formed by using this feature.

The first pattern area formed using the first patterning step includes a first groove pattern having a depth gradient of 0 nm to 40 nm per 5 mm. Specifically, when the support having the inclined surface is not used, the first groove pattern of the first pattern area may not substantially have the depth gradient or may have a depth gradient of 10 nm or less per 5 mm. Further, when the support having the inclined surface is used, the first groove pattern of the first pattern area may have a depth gradient of 10 nm to 40 nm per 5 mm.

In the first patterning step, a first pattern area having a depth gradient smaller than the depth gradient of the second groove pattern area may be formed by using the Faraday cage without the shutter.

According to an embodiment of the present invention, the mesh portion in the first patterning step may not be substantially shielded by the shutter. Specifically, the mesh portion in the first patterning step may not be substantially shielded by the shutter as an area of 10% or less is shielded by the shutter.

According to an embodiment of the present invention, a second patterning step of shielding at least a part of the mesh portion using the shutter and then, forming a second pattern area on the substrate for etching using the plasma etching may be forming the second pattern area continuously provided in the first pattern area after the first patterning step.

FIG. 3 is a schematic illustration of a second patterning step in a plasma etching method according to an embodiment of the present invention. Specifically, FIG. 3 illustrates that one area of the mesh portion of the Faraday cage is shielded using the shutter and then, the substrate for etching, which is subjected to the first patterning step is patterned.

In the case of shielding one area of the mesh portion of the Faraday cage by using the shutter, the etching speed is drastically reduced as a distance from the mesh portion increases, and as a result, a second pattern area including a groove pattern having a large depth gradient may be formed by using the decreased etching speed.

According to an embodiment of the present invention, the second patterning step may include aligning the substrate for etching such that an area where the depth gradient of the second pattern area starts and an end of the shutter are on the same line. That is, since the area shielded by the shutter is not subjected to the plasma etching, the second pattern area may be formed after a position of the substrate for etching is adjusted.

According to an embodiment of the present invention, the second patterning step may be forming the second pattern area by etching an area of the substrate for etching, the area including at least a part of the first pattern area formed by the first patterning step. Specifically, the second patterning area may be formed by using the second patterning step in an area where a pattern is formed on the substrate for etching through the first patterning step. That is, the second pattern area may include an area which passes through both the first patterning step and the second patterning step.

The second pattern area formed using the second patterning step includes a second groove pattern having a depth gradient of 50 nm to 300 nm per 5 mm. Specifically, when the support having an inclined surface is used, since the second groove pattern of the second pattern area may realize a very high depth gradient, pattern areas having different depth gradients may be formed through two-step patterning steps.

According to an embodiment of the present invention, the substrate for etching may maintain a separation distance of at least 7 mm from the mesh portion.

The present inventors carried out the plasma etching using ICP-RIE (Oxford's plasmaLab system 100) after installing a support having an inclined surface of 40° in the Faraday cage and providing the substrate for etching on the support. In this case, $O_2$ and $C_4F_8$ were mixed as reactive gas at a ratio of 1:9 and supplied at a flow rate of 50 sccm. Further, etching was performed with RF power of 150 W, ICP power of 2 kW, and operating pressure of 7 to 10 mTorr for 3 minutes as etching conditions. The etching rate depending on the distance from the mesh portion of the Faraday cage was measured and a result thereof is shown in FIG. 4.

FIG. 4 is a graph showing the measurement of an etching rate according to a distance from a mesh portion of a Faraday cage. According to the results shown, a distance at which the plasma etching is not substantially performed may be extrapolated to be at a position that is approximately 75 mm from the mesh portion. As a result, the patterning may be designed by considering the predicted position. Further, when the distance between the mesh portion and the substrate for etching is approximately 6 mm or less, it has been found that there is a problem in that a mesh lattice pattern of the mesh portion acts like an etching mask and remains in an etching area. Therefore, it may be necessary that the substrate for etching maintains a separation distance of at least 7 mm from the mesh portion.

According to an embodiment of the present invention, the substrate for etching may be a quartz substrate or a silicon wafer. When a plasma etching method using the Faraday cage is used, generation of the needle-shaped structure that may occur when patterning glass such as the quartz substrate or the silicon wafer as the substrate for etching may be greatly reduced.

According to an embodiment of the present invention, the metal mask may be used for forming the first pattern area and the second pattern area and an opening pattern portion of the mask may be an area corresponding to the first groove pattern and/or the second groove pattern.

FIG. 5 illustrates an example of a diffraction grating light guide plate manufactured using a patterned etching substrate manufactured according to a plasma etching method according to an exemplary embodiment. Specifically, FIG. 5 illustrates a diffraction grating light guide plate manufactured using the patterned substrate for etching and a groove pattern corresponding to a pattern portion in which light is extracted from the diffraction grating light guide plate to provide display information to a user. In a pattern of an area in which the light is extracted, an area may be required in which a height of a pattern structure gradually increases and the height of the pattern structure increases with a relatively low height gradient in order to extract a higher quality image and the height of the pattern structure increases with a rapidly high gradient. When a pattern structure in which a height gradient rapidly increases is required, a mold substrate for the diffraction grating light guide plate may be manufactured using the manufacturing method.

The mesh portion of the Faraday cage draws free electrons on a contact surface with the plasma to form a sheath during the plasma etching. Furthermore, the mesh portion may have conductivity to accelerate the free electrons having a negative charge.

Furthermore, the mesh portion may be provided flat on one surface of the Faraday cage and the etching speed at a curved portion may be locally varied when the curved portion exists.

According to an embodiment of the present invention, the mesh portion may have sheet resistance of 0.5 Ω/sq or more. Specifically, according to an embodiment of the present invention, the sheet resistance of the mesh portion may be 0.5 Ω/sq or more and 100 Ω/sq or less.

When the sheet resistance of the mesh portion is 0.5 Ω/sq or more, the etching speed for each position may be maintained constant in the Faraday cage during the plasma etching. Further, when the sheet resistance of the mesh portion is less than 0.5 Ω/sq, there is a problem that it is difficult to perform precise etching because the etching speed is irregular at each position of the Faraday cage during the plasma etching. Furthermore, when the sheet resistance of the mesh portion is 0.5 Ω/sq or more, the etching speed for each position in the Faraday cage may be maintained constant and when the sheet resistance exceeds 100 Ω/sq, an increase of an effect may be insignificant and only manufacturing cost may increase.

According to an embodiment of the present invention, in the mesh portion, carbon fluoride radicals may be adsorbed on a metal mesh. Specifically, the fluorocarbon radical may be —CF, —CF$_2$, —CF$_3$, or —C$_2$F$_x$ (x=an integer of 1 to 5). Specifically, the fluorocarbon radicals may be adsorbed on the mesh portion by etching and surface polymerization by F radicals during the plasma etching in the mesh portion of the Faraday cage.

According to an embodiment of the present invention, in the mesh portion, the carbon fluoride radicals are adsorbed on a conductive material such as a metal to exhibit the sheet resistance described above.

According to an embodiment of the present invention, the mesh portion may adopt a mesh made of a stainless material. Specifically, a commercially available mesh of SUS304 material #200 (pitch: 125 μm, wire diameter: 50 μm, aperture ratio: 36%) may be used. However, the present invention is not limited thereto, and the mesh portion may be made of Al, Cu, W, Ni, Fe, or an alloy containing at least two of them. Furthermore, a porosity and a lattice size of the mesh may be freely adjusted according to a usage of the etching.

According to an embodiment of the present invention, in the plasma etching, an inductively coupled plasma reactive ion etching equipment (ICP-RIE) may be used. Specifically, the patterning step may be performed by providing the Faraday cage in the inductively coupled plasma reactive ion etching equipment (ICP-RIE). In addition, the plasma etching may also adopt a helicon plasma scheme, a helical resonance plasma scheme, or an electron resonance plasma scheme.

According to an embodiment of the present invention, the plasma etching may include adjusting an output of a plasma etching apparatus to 0.75 kW to 4 kW. Specifically, the output of the plasma etching apparatus may be adjusted to 0.75 kW to 3 kW, 0.75 kW to 1.5 kW, or 0.75 kW to 1 kW.

When the output of the plasma etching apparatus is adjusted within the above range, formation of the needle-shaped structure may be further suppressed, which occurs when patterning the substrate for etching, specifically, the quartz substrate or the silicon wafer and the size of the generated needle-shaped structure may be significantly suppressed to be small.

According to an embodiment of the present invention, the plasma etching may include supplying mixed gas containing the reactive gas and oxygen gas to the plasma etching apparatus at a flow rate of 10 sccm to 75 sccm. Specifically, the plasma etching may include supplying to the plasma etching apparatus the mixed gas at a flow rate of 15 sccm to 75 sccm, 25 sccm to 70 sccm, 30 sccm to 70 sccm, 40 sccm to 60 sccm, or 45 sccm to 55 sccm.

When the supply flow rate of the reactive gas is adjusted to the above range, formation of the needle-shaped structure may be further suppressed, which occurs when patterning the substrate for etching, specifically, the quartz substrate or the silicon wafer and the size of the generated needle-shaped structure may be significantly suppressed to be small.

According to an embodiment of the present invention, as the reactive gas, general reactive gas used in the plasma etching may be used. For example, gas including SF$_6$, CHF$_3$, C$_4$F$_8$, CF$_4$, and Cl$_2$ may be used.

According to an embodiment of the present invention, a content of the oxygen gas flow rate in the total flow rate of the mixed gas may be 1% to 20%. Specifically, the content of the oxygen gas flow rate in the total flow rate of the mixed gas may be 1% to 15%, 1% to 10%, or 1% to 5%.

When the content of the oxygen gas flow rate in the flow rate of the mixed gas is within the above range, formation of the needle-shaped structure may be further suppressed, which may occur when patterning the substrate for etching, specifically, the quartz substrate or the silicon wafer and the size of the generated needle-shaped structure may be significantly made to be small.

According to an embodiment of the present invention, the bottom surface of the Faraday cage may include metal having a lower ionization tendency than the metal mask.

When the ionization tendency of the material of the bottom surface of the Faraday cage is lower than the ionization tendency of the material of the metal mask, formation of the needle-shaped structure may be further suppressed, which may occur when patterning the substrate for etching, specifically, the quartz substrate or the silicon wafer and the size of the generated needle-shaped structure may be significantly made to be small.

According to an embodiment of the present invention, the bottom surface of the Faraday cage may include metal whose standard reduction potential is higher than a standard reduction potential of the metal mask by 1 V or more. Specifically, the bottom surface of the Faraday cage may be made of the metal whose standard reduction potential is higher than the standard reduction potential of the metal mask by 1 V or more. Further, an average standard reduction potential of the metal constituting the bottom surface of the Faraday cage may be higher than the standard reduction potential of the metal mask by 1 V or more. The average standard reduction potential of the metal constituting the bottom surface of the Faraday cage may be calculated in consideration of the content of the metal constituting the bottom surface of the Faraday cage and the standard reduction potential. For example, for SUS304 consisting of 18 wt % Cr, 8 wt % Ni, and 74 wt % Fe, the average standard reduction potential may be −0.333 V. For reference, the standard reduction potential of Cr is −0.74 V, the standard reduction potential of Fe is −0.45 V, the standard reduction potential of Ni is −0.26 V, the standard reduction potential of Al is −1.66 V, and the standard reduction potential of Cu is 0.34 V.

According to an embodiment of the present invention, the bottom surface of the Faraday cage may include metal whose standard reduction potential is higher than the standard reduction potential of the metal mask by 1 V or more, 1.5 V or more, or 1.9 V or more. Further, according to an embodiment of the present invention, the average standard reduction potential of the metal constituting the bottom surface of the Faraday cage may be higher than the standard reduction potential of the metal mask by 1 V or more, 1.5 V or more, or 1.9 V or more.

In the case where the standard reduction potential of the metal included in the bottom surface of the Faraday cage is described above, generation of the needle-shaped structure during patterning of the substrate for etching, specifically, the quartz substrate or the silicon wafer may be minimized and furthermore, the size of the generated needle-shaped structure may be minimized.

According to an embodiment of the present invention, the metal mask includes at least one of aluminum and chromium. Specifically, the metal mask may be made of aluminum.

According to an embodiment of the present invention, the bottom surface of the Faraday cage may include at least one of iron, nickel, and copper. Specifically, the bottom surface of the Faraday cage may be a metal plate made of stainless steel, which is copper or an alloy of iron, chromium, and nickel.

According to an embodiment of the present invention, the metal mask is an aluminum made mask, and the bottom surface of the Faraday cage may be a copper made or SUS304 stainless steel made metal plate.

According to an embodiment of the present invention, the metal mask may include at least one of aluminum and chromium and the bottom surface of the Faraday cage may include copper. Specifically, the metal mask may be made of aluminum having a purity of 95% or more and the bottom surface of the Faraday cage may be a copper plate having a purity of 95% or more.

As described herein, when the ionization tendency of the bottom surface material of the Faraday cage is lower than the ionization tendency of the metal mask material and/or the standard reduction potential of the bottom surface material of the Faraday cage is higher than the standard reduction potential of the metal mask material by 1 V or higher, the generation of the needle-shaped structure during patterning of the substrate for etching, specifically, the quartz substrate or the silicon wafer may be remarkably suppressed and the size of the generated needle-shaped structure may be remarkably suppressed to be small.

According to an embodiment of the present invention, the substrate for etching obtained via patterning may be for use as a mold substrate for a diffraction grating light guide plate. Specifically, each of the first pattern area and the second pattern area of the substrate for etching may be one pattern area of a mold for the diffraction grating light guide plate.

An embodiment of the present invention provides a method for manufacturing a diffraction grating light guide plate, which includes: preparing a substrate in which a diffraction grating pattern is formed by using a plasma etching method using the Faraday cage; applying a resin composition on a quartz substrate on which the diffraction grating pattern is formed; providing a transparent substrate on an opposite side of a surface provided with the diffraction grating pattern; forming the diffraction grating pattern by curing the resin composition; and forming a diffraction grating light guide plate by separating the quartz substrate and the diffraction pattern.

The resin composition may be used without limitation as long as the resin composition is a resin composition generally used in the art. Furthermore, the applying of the resin composition may be performed by using a coating method generally used in the art, such as spin coating, deep coating, drop casting, etc.

The method for manufacturing the diffraction grating light guide plate may adopt a method for forming a general pattern layer except that the quartz substrate patterned by the plasma etching method using the Faraday cage is used.

The diffraction grating light guide plate may be used as a direct diffraction grating light guide plate. Further, a final product may be manufactured by a method of using the diffraction grating light guide plate as an intermediate mold and replicating the diffraction grating light guide plate. Specifically, when the diffraction grating light guide plate is manufactured after the mold for the diffraction grating light guide plate is manufactured by using the manufactured diffraction grating light guide plate as the intermediate mold, the slope of the grating pattern of the diffraction grating light guide plate used as the intermediate mold may be inverted.

Furthermore, when the diffraction grating light guide plate is manufactured after the mold for the diffraction grating light guide plate is manufactured by using the diffraction grating light guide plate of which the slope of the grating pattern as the intermediate mold is inverted, a grating pattern in the same direction as an initial diffraction grating light guide plate may be implemented.

Hereinafter, the present invention will be described in detail with reference to the examples for a specific description. However, the Examples according to the present invention may be modified in various forms, and it is not interpreted that the scope of the present invention is limited to the Examples described below. The Examples of the present invention will be provided for more completely explaining the specification to those skilled in the art.

EXAMPLES

Reference Example 1

A Faraday cage in which sheet resistance of the mesh portion is 0.5605 Ω/sq and the bottom surface is a stainless (SUS304) plate was prepared. In addition, the Faraday cage was provided in an inductively coupled plasma reactive ion etching equipment (ICP-RIE) (Oxford's plasmaLab system 100).

Further, Al was deposited on a glass substrate having a thickness of 2 mm to form an Al layer. Further, after photoresist is spin-coated on the Al layer, the photoresist is developed by UV curing using a photomask having a pitch of 405 nm, and then the Al layer is selectively etched to form an Al metal mask on the glass substrate.

A glass substrate having the Al metal mask was provided on the support after the Al made support having a slope of 40° was installed in the Faraday cage. In this case, a minimum separation distance between the glass substrate and the mesh portion was 7 mm, and there was no shielding of the mesh portion using a separate shutter.

Then, the plasma etching was performed using ICP-RIE (Oxford's plasmaLab system 100) and $O_2$ and $C_4F_8$ were mixed as the reactive gas at a ratio of 5:45, and supplied at a flow rate of 50 sccm. Further, etching was performed with ICP power of 2 kW, and operating pressure of 7 to 10 mTorr for 3 minutes as etching conditions.

FIG. 6 illustrates an etching depth in a vertical direction for each position in inclination etching according to Reference Example 1. A horizontal axis of FIG. represents a distance from one side of the glass substrate positioned close to the mesh portion to the other side and a vertical axis represents a vertical depth etched for each position. Referring to FIG. 6, it can be seen that as the distance from the mesh portion increases, the etching rate gradually decreases, and the etching rate tends to increase again at a position where a high etching area exists. Further, the present inventors have found that, in optical design of the diffraction grating light guide plate, it is necessary to drastically increase the gradient of the etching depth in the interval of approximately 35 mm to approximately 45 mm in the interval of approximately 25 mm to approximately 45 mm of the glass substrate, but it was difficult to implement the above fact by the plasma etching method using the Faraday cage in the related art.

Reference Example 2

The same inductively coupled plasma reactive ion etching equipment and the Faraday cage as in Reference Example 1 were used and a half area of the mesh portion of the Faraday cage was shielded by using the shutter. Then, a planar Al made support was installed in the Faraday cage and the glass substrate provided with the Al metal mask manufactured in the same manner as in Reference Example 1 was provided on the support. In this case, the separation distance between the glass substrate and the mesh portion was 7 mm and the half region of the glass substrate was position-adjusted so as to be located in the mesh portion shielded with the shutter.

Then, the plasma etching was performed using ICP-RIE (Oxford's plasmaLab system 100) and $O_2$ and $C_4F_8$ were mixed as the reactive gas at a ratio of 5:45, and supplied at a flow rate of 50 sccm. Further, etching was performed with ICP power of 2 kW, and operating pressure of 7 to 10 mTorr for 3 minutes as etching conditions.

FIG. 7 illustrates an etching depth in a vertical direction for each position in inclination etching according to Reference Example 2. A horizontal axis of FIG. 7 represents a distance from one side of the glass substrate positioned close to the mesh portion to the other side and a vertical axis represents a vertical depth etched for each position. According to FIG. 7, it can be seen that the gradient of the etching depth is abruptly implemented in the adjacent area of the mesh portion.

Reference Example 3

Except that a glass substrate having the Al metal mask was provided on the support after the Al made support having a slope of 40° was installed in the Faraday cage, the glass substrate was etched by the same method as Reference Example 2.

FIG. 8 illustrates an etching depth in a vertical direction for each position in inclination etching according to Reference Example 3. A horizontal axis of FIG. represents a distance from one side of the glass substrate positioned close to the mesh portion to the other side and a vertical axis represents a vertical depth etched for each position. According to FIG. 8, it can be seen that the 35 mm to 45 mm interval of the glass substrate adjacent to the shutter is etched to have a very steep depth gradient and the other portions are etched to have a gentle depth gradient.

Using results of Reference Examples 1 to 3, the present inventors completed the present invention.

Example 1

The glass substrate was subjected to plasma etching in the same method as in Reference Example 1 to perform primary patterning. Further, the half area of the mesh portion was shielded by using the shutter, the glass substrate was positioned so that the 35 mm point of the primarily patterned glass substrate and the end of the shutter portion were aligned, and then plasma etching was performed under the same conditions as primary plasma etching to perform secondary patterning.

FIG. 1 is a photograph showing a Faraday cage used in example and a case where the Faraday cage is equipped with a shutter. Specifically, a left Faraday cage indicates a Faraday cage in primary patterning and a right Faraday cage indicates a Faraday cage in which a part of the mesh portion in secondary patterning is shielded by the shutter.

FIG. 9 illustrates an etching depth in a vertical direction for each position in inclination etching according to Example 1. According to FIG. 9, it can be seen that the result of Example 1 may have a gentle depth gradient and a steep depth gradient similarly as in the design.

FIG. 10 is an image obtained by observing an etching portion from a point from a glass substrate etched according to Example 1 by 3 mm with a scanning electron microscope (SEM).

FIG. 11 is an image obtained by observing an etching portion from a 12 mm point from a glass substrate etched according to Example 1 with a scanning electron microscope (SEM).

FIG. 12 is an image obtained by observing an etching portion from a 15 mm point from a glass substrate etched according to Example 1 with a scanning electron microscope (SEM).

FIG. 13 is an image obtained by observing an etching portion from a 19 mm point from a glass substrate etched according to Example 1 with a scanning electron microscope (SEM).

Referring to FIGS. 10 to 13, it can be confirmed that the etching area having the gentle depth gradient and the etching area having the steep depth gradient are simultaneously present as in the result shown in FIG. 9. Furthermore, as seen in FIGS. 10 to 13, when the etching is performed using the shutter, it can be seen that the generation of the needle-shaped structure may be almost removed.

For reference, the needle-shaped structure was formed when the plasma etching is performed without a shutter portion having a depth similar to that of FIG. 13, which is illustrated in FIG. 14. FIG. 14 illustrates an etching portion in the vicinity of an approximately 10-mm point from the glass substrate etched according to Reference Example 1. According to FIG. 14, it can be seen that a considerably large number of needle-shaped structures are formed.

On the other hand, the glass substrate etched according to Example 1 may suppress the needle-shaped structure in the high etching area by removing the needle-shaped structure generated as in FIG. 14 through the secondary patterning using the shutter.

Example 2

Except that a glass substrate provided with an Al metal mask was provided on the bottom surface of the Faraday cage to adjust the separation distance between the glass substrate and the mesh portion to be 40 mm without using the support having the inclined surface, the primary patterning was performed by plasma-etching the glass substrate in the same method as Reference Example 1.

Further, the primarily patterned glass substrate was provided on a flat Al made support as in Reference Example 2, and the separation distance between the glass substrate and the mesh portion was adjusted to 7 mm and the glass substrate is positioned so that the 20 mm point of the glass substrate and the end of the shutter portion are aligned and then, plasma-etched to perform the secondary patterning under the same condition as the primary plasma etching.

FIG. 15 illustrates an etching depth for each position in vertical etching according to Example 2. According to FIG. 15, it can be seen that the result of Example 2 may have a gentle depth gradient and a steep depth gradient similarly as in the design.

When the plasma etching method according to the present invention is applied as a result of examining result, it can be seen that it is possible to manufacture a mold substrate having various depth gradients and manufacture an etching substrate having a high quality, specifically, the mold substrate for the diffraction grating light guide plate by suppressing the generation of the needle-shaped structure in the high etching area.

The invention claimed is:

1. A plasma etching method using a Faraday cage, comprising:
   providing an etch substrate in a Faraday cage, wherein the etch substrate comprises a metal mask provided on one surface thereof, and wherein an upper surface of the Faraday cage is provided with a mesh portion;
   a first patterning step of forming a first pattern area on the etch substrate; and
   a second patterning step of forming a second pattern area on the etch substrate after shielding at least a part of the mesh portion with a shutter,
   wherein the first pattern area includes a first groove pattern having a depth gradient of 0 to 40 nm per 5 mm, and
   the second pattern area includes a second groove pattern having a depth gradient of 50 to 300 nm per 5 mm.

2. The plasma etching method of claim 1, wherein the shutter shields 20 to 80% of the mesh portion.

3. The plasma etching method of claim 1, wherein the second patterning step includes aligning the etch substrate such that an area where the depth gradient of the second pattern area starts and an end of the shutter are on a common line.

4. The plasma etching method of claim 1, wherein the second patterning step includes forming the second pattern area by etching an area of the etch substrate, the area of the etch substrate including at least a part of the first pattern area formed in the first patterning step.

5. The plasma etching method of claim 1, wherein the etch substrate is provided on a support having an inclined surface, and
   the first groove pattern and the second groove pattern are inclined groove patterns.

6. The plasma etching method of claim 1, wherein the etch substrate maintains a separation distance of at least 7 mm from the mesh portion.

7. The plasma etching method of claim 1, wherein the etch substrate is a quartz substrate or a silicon wafer.

8. The plasma etching method of claim 1, wherein the mesh portion has a sheet resistance of 0.5 Ω/sq or more.

9. The plasma etching method of claim 8, wherein the mesh portion comprises carbon fluoride radicals adsorbed on a metal mesh.

10. The plasma etching method of claim 1, wherein the plasma etching is carried out by adjusting an output of a plasma etching apparatus to 0.75 kW or more and 4 kW or less.

11. The plasma etching method of claim 1, wherein the plasma etching comprises supplying a mixed gas containing a reactive gas and oxygen gas to a plasma etching apparatus at a rate of 10 sccm or more and 75 sccm or less.

12. The plasma etching method of claim 11, wherein a content of the oxygen gas flow amount in the total flow amount of the mixed gas is 1% or more and 20% or less.

13. The plasma etching method of claim 1, wherein a bottom surface of the Faraday cage includes a metal having a lower ionization tendency than the metal mask.

14. The plasma etching method of claim 1, wherein a bottom surface of the Faraday cage includes a metal whose standard reduction potential is higher than a standard reduction potential of the metal mask by 1 V or more.

15. The plasma etching method of claim 1, wherein the metal mask includes at least one of aluminum and chromium and a bottom surface of the Faraday cage includes copper.

16. The plasma etching method of claim 1, wherein the etch substrate after patterning is suitable for use as a mold substrate for a diffraction grating light guide plate.

17. A mold substrate for a diffraction grating light guide plate, wherein the mold substrate comprises the substrate after patterning using the plasma etching method of claim 1.

* * * * *